United States Patent
Cullen et al.

(10) Patent No.: US 7,454,678 B2
(45) Date of Patent: Nov. 18, 2008

(54) SCAN STREAM SEQUENCING FOR TESTING INTEGRATED CIRCUITS

(75) Inventors: Jamie S. Cullen, San Jose, CA (US); Burnell G. West, Half Moon Bay, CA (US)

(73) Assignee: Credence Systems Corporation, Milpitas, CA (US)

( * ) Notice: Subject to any disclaimer, the term of this patent is extended or adjusted under 35 U.S.C. 154(b) by 103 days.

(21) Appl. No.: 11/210,553

(22) Filed: Aug. 23, 2005

(65) Prior Publication Data

US 2006/0005096 A1 Jan. 5, 2006

Related U.S. Application Data

(60) Division of application No. 10/861,587, filed on Jun. 4, 2004, now abandoned, which is a continuation of application No. 09/696,102, filed on Oct. 24, 2000, now Pat. No. 6,748,564.

(51) Int. Cl.
*G01R 31/28* (2006.01)
(52) U.S. Cl. .................................................. 714/729
(58) Field of Classification Search .......... 714/725–730
See application file for complete search history.

(56) References Cited

U.S. PATENT DOCUMENTS

| | | | |
|---|---|---|---|
| 4,687,988 A * | 8/1987 | Eichelberger et al. ...... 324/73.1 |
| 4,931,723 A | 6/1990 | Jeffrey et al. |
| 4,947,357 A | 8/1990 | Stewart et al. |
| 5,029,166 A | 7/1991 | Jarwala et al. |
| 5,122,988 A | 6/1992 | Graeve |
| 5,187,712 A | 2/1993 | Malleo-Roach et al. |
| 5,212,443 A | 5/1993 | West et al. |
| 5,239,262 A * | 8/1993 | Grutzner et al. ............. 714/733 |
| 5,321,701 A | 6/1994 | Raymond et al. |
| 5,477,139 A | 12/1995 | West et al. |
| 5,479,414 A * | 12/1995 | Keller et al. ................. 714/726 |
| 5,574,731 A | 11/1996 | Qureshi |
| 5,606,568 A | 2/1997 | Sudweeks |
| 5,675,589 A | 10/1997 | Yee |
| 5,701,309 A | 12/1997 | Gearhardt et al. |
| 5,701,335 A | 12/1997 | Neudeck |

(Continued)

FOREIGN PATENT DOCUMENTS

WO WO 99/14611 3/1999

OTHER PUBLICATIONS

Preliminary Search Rep. Jul. 29, 2003, France.

(Continued)

*Primary Examiner*—Cynthia Britt (57) ABSTRACT

A system and method for processing scan data for integrated circuit testing. Scan data is divided into three groups of scan data segments: scan-in data segments, scan-out data segments and scan-mask data segments. The sequence of scan data segments in each group constitutes the operative test data in a scan stream. Each scan stream is represented by a table having a row corresponding to each scan data segment in the stream. Each row has four fields: a start address, a segment length, a start pad length and an end pad length. Scan streams consist of the bit sequence of segment data interposed by dummy data corresponding in length to the start pad and end pad lengths. Scan streams are interleaved by using the pad lengths to time the processing of scan data segments.

8 Claims, 7 Drawing Sheets

U.S. PATENT DOCUMENTS

| | | | |
|---|---|---|---|
| 5,802,075 | A | 9/1998 | Carpenter et al. |
| 5,825,787 | A | 10/1998 | Statovici |
| 5,838,694 | A | 11/1998 | Illes et al. |
| 5,913,022 | A | 6/1999 | Tinaztepe et al. |
| 5,923,675 | A | 7/1999 | Brown et al. |
| 5,928,374 | A | 7/1999 | Shimizu et al. |
| 6,014,763 | A | 1/2000 | Dhong et al. |
| 6,014,764 | A | 1/2000 | Graeve et al. |
| 6,049,901 | A | 4/2000 | Stock et al. |
| 6,134,687 | A | 10/2000 | Chakradhar et al. |
| 6,242,269 | B1 | 6/2001 | Whetsel |
| 6,557,129 | B1 | 4/2003 | Rajski et al. |
| 6,748,564 | B1 | 6/2004 | Cullen et al. |
| 6,769,081 | B1 * | 7/2004 | Parulkar .................... 714/733 |

OTHER PUBLICATIONS

Wunderlich, H.J.; Hellebrand, S.; The Pseudoexhaustive test of sequential circuits; Proceedings International Test Conference, 'Meeting the Tests of Time'; Aug. 29-31, 1989; pp. 19-27.

Hamzaoglu, I.; Patel, J.H.; Reducing test application time for full scan embedded cores; Digest of Papers Twenty-Ninth Annual International Symposium on Fault-Tolerant Computing; Jun. 15, 1999-Jun. 18, 1999; pp. 260-267.

Song Ho Lee; hyun Chul Noh; compact test generation for full scan sequential circuits using multiple frame vectors; Electronics Letters; vol. 35, Issue: 3; Feb. 4, 1999 (pp. 182-183).

T. Yamaguchi, "An Efficient Method for Compressing Test Data", International Test Conference; IEEE, 1997, Paper 4.1, pp. 79-88.

"International Technology Roadmap for Semiconductors, 2000 Update, Test and Test Equipment", 5 pages.

Lee Whetsel, Update Presentation of the IEEE P1500 Scaleable Architecture for Testing Embedded Cores, IEEE P1500 Architecture Task Force, 2000, Copyright @ 2000 IEEE P1500, May 5, 2009, 9 pages.

E. B. Eichelberger, T.W. Williams "A Logic Design Structure for LSI Testability", In Proc., 14th Design Automation Conference, Jun. 1977, pp. 462-468.

E. E. Muehldorf, "Designing LSI Logic for Testability", ITC 1976, pp. 45-49.

H. Bouwmeester et al., "Minimizing Test Time by Exploiting Parallelism in Macro Test", ITC 1993, pp. 451-460.

J. Aerts, E. Marinissen, "Scan Chain Design for Test Time Reduction in Core-Based ICs," ITC, 1998.

T. Wood, "The Test and Debut Features of the AMD K7 Microprocessor,"ITC, 1999.

A. Jas and N. Touba, "Test Vector Decompression via Cyclical Scan Chains and its Application to Testing Core-Based Designs," ITC, 1998.

Hansen, Peter, "Testing Conventional Logic and Memory Clusters Using Boundary Scan Devices as Virtual ATE Channels," ITC, 1989.

* cited by examiner

SCAN STREAM SEQUENCING FOR TESTING INTEGRATED CIRCUITS

CROSS-REFERENCE TO RELATED APPLICATIONS

This application is a divisional of and claims priority to co-pending application Ser. No. 10/861,587 titled "Scan Stream Sequencing for Testing Integrated Circuits" filed on Jun. 4, 2004 which is a continuation of and claims priority to application Ser. No. 09/696,102 titled "Scan Stream Sequencing for Testing Integrated Circuits" filed on Oct. 24, 2000 and issued as U.S. Pat. No. 6,748,764 on Jun. 8, 2004. The contents of these applications are hereby incorporated by reference in their entirety.

FIELD OF THE INVENTION

The present disclosure relates to testing integrated circuits and to scan-based testing of integrated circuits.

BACKGROUND

The use of scan-based techniques for testing integrated circuits (ICs) has become essential as IC component (e.g., transistor) density has increased. One reason for this is that due to size constraints, component density has far outstripped the number of electrical connectors, typically referred to as input/output pins, capable of being built into an IC. Thus, a circuit tester testing IC functionality via a limited number of pins encounters increasing difficulty in adequately reaching the voluminous number of state permutations and transitions provided by increased integration. As a result, modern ICs are typically equipped with scannable logic elements to facilitate testing. A typical scannable IC includes one or more sets of state-holding elements (registers) interposed between circuit components and/or between circuit components and input/output pins. During normal operations, the state-holding elements are transparent to or incorporated as part of the functionality of the IC; in test mode, they are configurable as a serial shift register, or "scan-chain," typically by linking the output of one state-holding element to the input of another. The "scan-chain" permits scan test data to be serially shifted into and out of the by a tester. Strategically placed scan-chains also enable a tester to target one or more internal modules (e.g., a functional grouping of transistors) for individualized testing; in these situations, typically only a portion of the scan-chain needed to complete the test is filled with scan-data. Currently, the number and length of scan-chains vary per the device, but typically range in number between twenty and one-hundred, and in length upward of a thousand or more interconnected state-holding elements. Many devices with a single scan-chain have been fabricated.

In a typical circuit test, a tester applies digital signal patterns to the pins of a device under test ("DUT"). The content, sequence and timing of test patterns are dependent on the architecture of the particular DUT, and are typically generated by the DUT manufacturer with the IC design software used for designing the DUT. There are two predominant types of test patterns used in the prior art: scan test patterns and functional test patterns. Scan test patterns are bit patterns used to test selected states in a DUT's scan-chain; functional patterns are bit patterns typically applied in parallel to the input pins on the DUT to test functionality at the pin level. There are three predominant types of scan test patterns in the prior art: a scan-in patterns, a scan-out pattern and a scan-mask pattern. The scan-in pattern is the bit sequence serially shifted into a scan-chain to configure the IC to a known starting state. The scan-out pattern is the bit sequence containing the expected states in a scan-chain resulting from the DUT's processing the scan-in pattern. The scan-mask pattern is a bit pattern used for filtering out states to be ignored in a particular test.

The steps in a typical scan test iteration are as follows: 1) the tester places the DUT in scan-test mode to configure the scannable logic into a scan-chain; 2) the tester serially shifts a scan-in pattern into the scan-chain with a scan clock via one or more DUT pins; 3) the tester switches the DUT to normal mode and applies one or more system clock signals to the DUT in combination with one or more functional patterns on the DUT input pins; 4) the DUT processes the test states in the scan-chain and the input pins; 5) the tester tests the states on the output pins, then switches the DUT back to scan-test mode; 6) the tester serially clocks out the states of the scan-chain with a scan clock for comparison with a scan-out pattern containing the expected results, ignoring states as indicated by the scan-mask pattern; and 7) the tester serially shifts in a new scan-in pattern with the scan clock, and repeats the above steps.

In the prior art, a "monolithic" approach for storing and processing scan patterns predominates. In this approach, all of the scan patterns used in a test sequence are typically stored in sequential order in a contiguous block of tester memory in bit lengths corresponding in length to the scan-chains they are designed to populate. Thus, the tester need only know the start address of the contiguous block of scan patterns to complete a scan test sequence on a DUT, and scan data controllers are typically limited in data retrieval to a straight-line method, i.e., they are only capable of retrieving words of data in a monolithic sequence. There are a number of inefficiencies encountered by this approach. First, modern DUT's may implement scan-chains of considerable length where only a specific sub-section of a scan-chain needs populating for a particular test. In a monolithic approach, a block of scan memory corresponding to the length of the scan-chain must be populated regardless of whether only a portion of the scan-chain is to be populated; this creates unused space ("dead space") in the memory before and after the relevant portion of scan data (the dead space is typically filled with "dummy data" consisting of pads of zeros). Dead space is costly due to the large memory requirements of a tester and the potentially large scan-chains employed; for example, modern testers may employ several dozen pins participating in a test of several tens of thousands of test patterns involving scan-chains with a depth of over a thousand state-holding elements. Second, particular scan patterns in a test sequence may be repeated. In the monolithic approach, said particular scan patterns must be written into memory each time they appear in the sequence, thus creating the possibility of data redundancy. Lastly, it is often desirable to re-sequence scan patterns into new test sequences. In the monolithic approach, which lacks any level of indirection, re-sequencing requires that an entirely new test sequence be created and downloaded as a block into a contiguous portion of memory. This introduces excessive complexity and processing time for test re-sequencing.

SUMMARY

The present disclosure is directed to apparatus and methods for, among other things, minimizing scan memory requirements for scan testers, re-sequencing scan tests efficiently, and interleaving scan data to save testing time. In one embodiment, an apparatus and method are provided for improving the storage and processing of scan data by enabling scan data to be stored in scan memory without the substantial dummy data sequences that are typical in "monolithic" scan testing and storage techniques; this is achieved by storing non-dummy scan data ("scan data segments") in separate segments in scan memory. Processing scan data segments is controlled by scan data segment pointers organized in a link table data structure ("link table"). In another embodiment, each scan data segment pointer is allocated a separate row in the link table. This method of storage enables the amount of scan memory to be substantially reduced, saving testing cost. In addition, scan data re-sequencing—which in typical "monolithic" scan techniques required the scan data itself to be entirely re-sequenced and rewritten in the scan memory—may now be performed by re-sequencing pointer data in the link table; thus, only link tables and associated data need to be re-sequenced and re-written into a memory—not the scan data itself—resulting in savings in testing time and cost. In another embodiment, a method is provided enabling (variable length) scan data segments to be interleaved during testing; this is achieved by delaying the processing of each scan data segment according to a pre-determined delay value. A method is provided for calculating delay values which optimizes the amount of scan data that may be simultaneously processed. Interleaving the scan data while conducting a scan test saves testing time, and therefore testing cost.

In some embodiments, a scan-data-immediate flag is associated with a scan data segment pointer which, if set, changes the mode in which link table data is processed. If the scan-data-immediate flag is set, stream controllers process link table rows as having two fields: a data field and a counter field. The data field contains the scan data segment itself, in contrast to a pointer to the scan data segment in memory, and a counter field containing a repeat value for how often the scan data segment is to be consecutively processed when scanned out by the stream controllers. Scan-data-immediate processing enables a scan-memory retrieval operation to be avoided, therefore saving scan processing cost and time. In another embodiment, a link table row contains a scan-disable flag which, if set, prevents data from being driven to the respective DUT pin during the processing of that row. In another embodiment, setting the scan-disable flag prevents data from being driven to the DUT pin for the remainder of the scan stream. Disabling scan data from certain DUT pins is sometimes useful to prevent excessive heat accumulation in the DUT; excessive heat may damage the DUT or lead to erroneous test results. Disabling scan data from certain DUT pins may also be useful when concentrating a scan test to a particular portion of the device, thus saving data analysis time.

DETAILED DESCRIPTION

In a typical scan test, tester leads are connected to the pins of a DUT, and used to transfer data between the tester and the DUT. In a typical scan test sequence, the tester changes the DUT from normal mode to scan mode (state-holding elements are configured into a scan-chain) and populates one or more DUT scan-chains with scan data via one or more pre-determined pins (as determined by the DUT architecture); scan data is transferred typically at a rate of one bit per scan clock cycle. After populating the scan-chain, the tester changes the DUT from scan mode back to normal mode, and proceeds to drive input test data in parallel to pre-determined pins on the DUT. The DUT then processes the scan data in the scan-chain for one or more clock cycles before the tester changes the DUT back from normal mode back to scan mode. Once back in scan mode, the tester retrieves the now processed scan data from the scan-chain through a predetermined pin (as determined by the DUT architecture). During this retrieval process, the tester typically serially compares the retrieved scan data to data stored in the tester consisting of expected results. In this manner, unexpected results are marked and processed, and problems in the IC diagnosed. Tester may additionally process a serial mask data sequence, or "scan-mask," for purposes of causing the tester to ignore the processing of a particular test result. For purposes of this disclosure, "scan data" will refer to all four types of data described above: data scanned into a DUT ("scan-in data"), data in the scan-chain processed by the DUT in test mode and then retrieved by the tester ("processed scan data"), data used by the tester to compare the processed scan data with expected results ("scan-out data"), and data used to indicate whether the results of a particular test are to be ignored ("scan-mask data"). The following additional definitions apply to this disclosure. "Scanning" refers to the process by which a tester serially processes scan data. "Scan test iteration" refers to the event consisting of scanning scan-in data into a scan-chain, executing the DUT in normal mode, and scanning out the processed scan data for comparison with scan-out data. "Scan data segment" refers to a non-padded (no dummy data of zeros), continuous bit pattern that generally constitutes either the scan-in data, scan-out data or scan-mask for a single scan test iteration. In one embodiment, three types of scan data segments needed for performing scan testing are stored in scan memory: a scan-in data segment, a scan-out data segment, and a scan-mask data segment. Often a scan data segment is designed to populate or test only a subset of a scan-chain; in this situation, the scan data segment typically refers to the scan data in the target portion under test, while the remainder of the scan-chain is typically populated with dummy data (e.g., pads of zeros or any other pre-determined values). "Scan stream" refers generally to a continuous bit sequence of scan data segments and dummy data needed for performing a scan test sequence.

Figure 1:
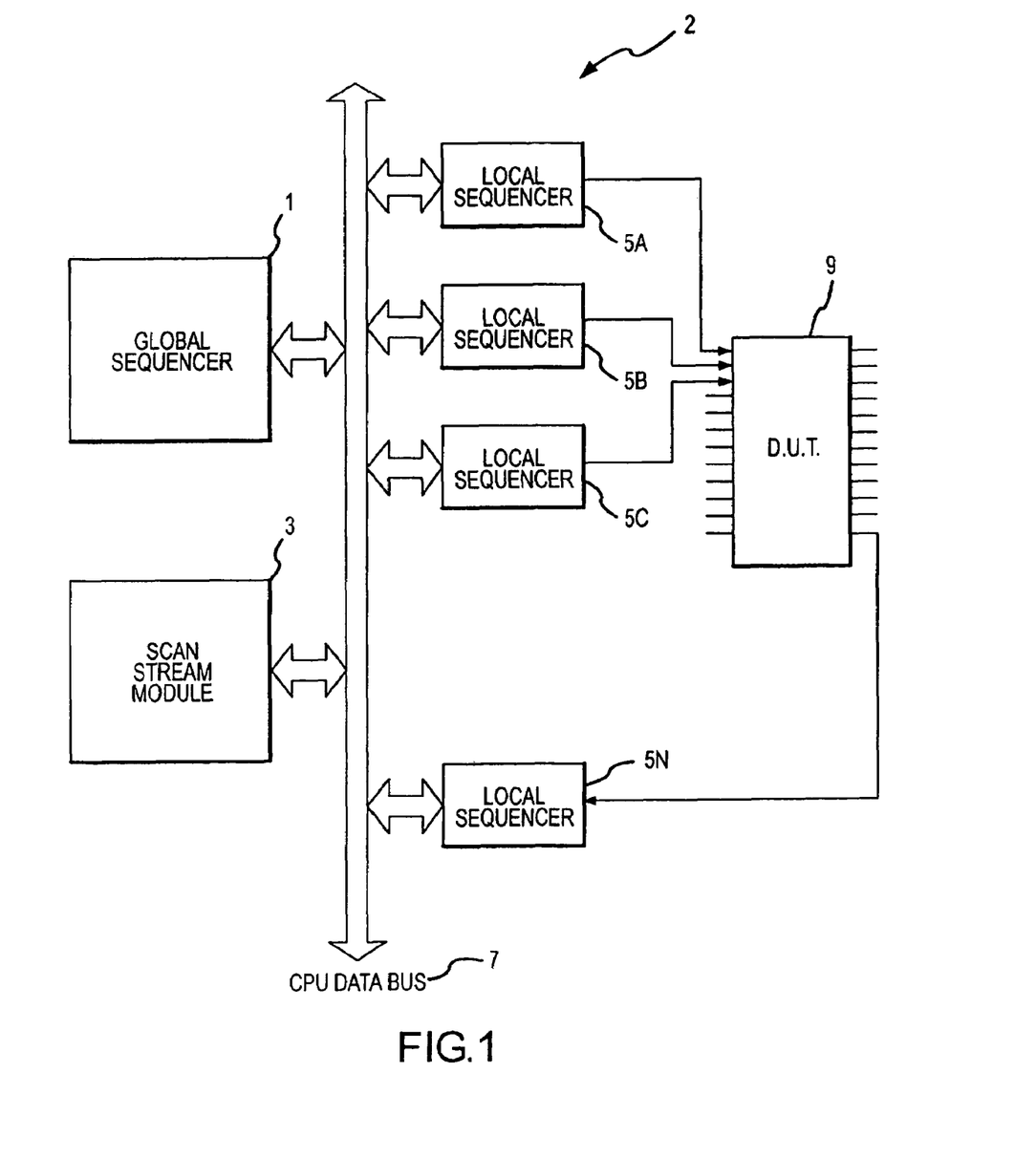
FIG. 1 is a block diagram of a processor-per-pin test system according to one embodiment.

FIG. 1 is a block diagram of a processor-per-pin IC test system 2 (tester plus DUT) in accordance with one embodiment. The test system 2 has a conventional processor-per-pin architecture, i.e., each pin of DUT 9 is connected to an output lead of a local sequencer 5N having typically a single processor. Each local sequencer 5A, . . . , 5N may be individually programmed to provide digital test signals to the DUT 9 independent of the signals applied by the other local sequencers 5N. Each local sequencer 5A, . . . , 5N is associated with one pin (terminal) on DUT 9. The local sequencers 5A, . . . , 5N are coordinated by timing patterns and instructions received over CPU data bus 7 from programmable global sequencer 1. Scan stream module 3 connects to the CPU data bus 7 to provide scan test functionality to the test system 2. Commonly-owned U.S. Pat. No. 5,122,988 discloses an example of the general architecture of a processor-per-pin tester (without scan-testing functionality) and is herein incorporated by reference. The tester of FIG. 1 is generally embodied in, for example, the ITS9000KX tester system commercially available by Schlumberger Automated Test Equipment, Inc.

The data used to perform a scan test depends on the architecture of the particular DUT 9 and is typically created by the DUT manufacturer in the process of designing the DUT 9. Because of the diversity of scan test data definitions used by DUT manufacturers, the manufacturer-produced scan test data typically requires translation into a format that can be read by test system 2. Translation is normally performed off-line by application software specifically tailored to the DUT manufacturer's testing definitions on a general purpose computer (not shown), such as a workstation, connected to CPU data bus 7 of test system 2. The application software takes as input a manufacturer's scan test definition, and provides as output scan test data readable by test system 2. The translated scan test data is then downloaded into a memory in scan stream module 3 in test system 2 for application to the DUT 9. A general purpose computer may be programmed to translate the DUT manufacturer's scan test definitions into scan test data readable by test system 2 using conventional programming techniques.

Figure 2:
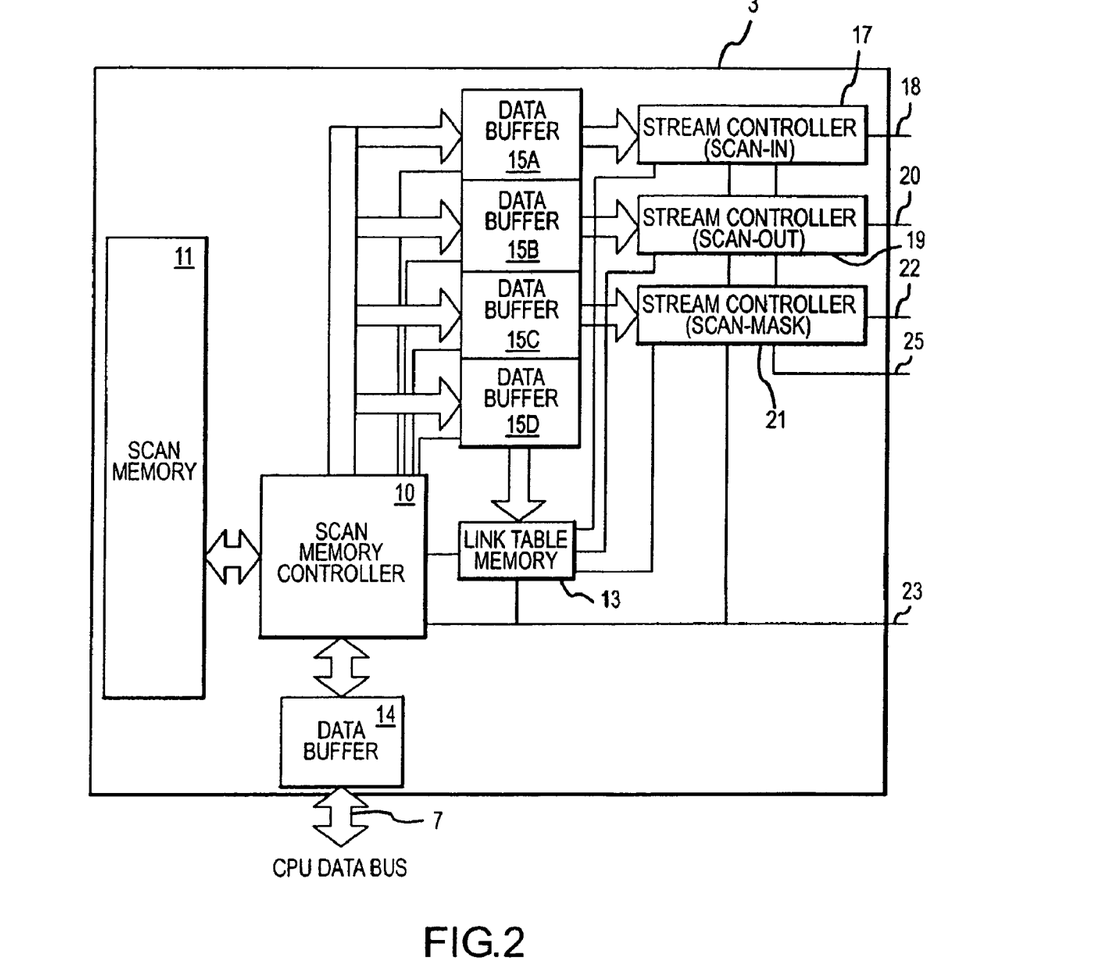
FIG. 2 is a block diagram of a scan stream module according to one embodiment.

FIG. 2 is a block diagram of one embodiment of scan stream module 3. Scan memory controller 10 instructs scan memory 11 to store scan data segments and associated link table data in response to a signal from global sequencer 1 (FIG. 1). In one embodiment, scan data segments and associated link table data are transmitted over the test system 2 CPU data bus 7 into scan memory 11 via data buffer 14; the scan data segments and associated link table data are, in turn, typically downloaded into test system 2 from a general purpose computer connected to test system 2. As mentioned in the previous paragraph, translation of a DUT manufacturer's scan test definition into scan data segments and associated link table data readable by scan stream module 3 is performed by application software running on a general purpose computer; the application software needed to perform this operation is coded according to conventional programming techniques. Referring back to FIG. 2, prior to performing a scan test, scan test module 3 is initialized by a signal sent over input line 23 by global sequencer 1 (FIG. 1) to scan memory controller 10, link table memory 13, and stream controllers 17, 19, 21. The initialization signal initiates the filling of data buffers 15A-C with scan data segments and the filling of data buffer 15D with link table data; the link table data is then stored in link table memory 13 for access by stream controller 17, 19, 21 and scan memory controller 10.

After initialization is complete, global sequencer 1 sends a series of scan increment signals over input line 25 to stream controllers 17, 19, 21; each scan increment signal causes stream controllers 17, 19, 21 to transmit the next bit of scan data to the DUT via stream controller output lines 18, 20, 22. Stream controllers 17, 19, 21 receive scan data segments from data buffers 15A-C, and, in this embodiment, transmit either a segment data segment bit or a dummy data bit in response to a scan increment signal. Each stream controller 17, 19, 21 is configured to read link table data from link table memory 13 associated with the scan data segment for the scan stream it is processing; this information controls whether the stream controller 17, 19, 21 is to transmit a dummy data bit or scan data segment bit. Dummy data is transmitted, for example, in order to properly time the processing of scan data segments for purposes of interleaving scan sequences; the timing algorithms for performing interleaving are provided in detail in reference to FIGS. 5-6. When a data buffer, e.g., 15A, requires filling, the buffer 15A sends a signal to scan memory controller 10 to retrieve the next scan data segment from scan memory 11; in response to this signal, scan memory controller 10 retrieves the start address in scan memory 11 of the next scan data segment in the scan stream from the link table data stored in link table memory 13. After retrieving the start address from link table memory 13, scan memory controller 10 retrieves the scan data segment from scan memory 11 and transmits the scan data segment to the requesting data buffer 15A. Those skilled in the art will recognize that many variations in circuit designs may perform the bit processing of the scan data segment and dummy data as disclosed herein; the current invention is not intended to be limited to the particular embodiment of FIG. 2.

Scan memory is typically large in a commercial circuit tester. In one embodiment, there are one-hundred and eight scan-streams each consisting of 256 Megavectors per scan stream (one Megavector equals one million one-bit vectors, or one million bits of data). This embodiment is implemented on three memory circuit boards with each circuit board containing six 72-bit ECC 256-megabyte DIMMs, such as standard PC100 SDRAMs. (Note that in typical commercial testers, such circuit boards may be added to provide additional capacity). This configuration may be expanded (e.g., up to 1 Gigavector memory depth, which generally consists of three scan streams each having in excess of one billion bits of data). Those skilled in the art will recognize that scan-streams and associated data structures (e.g., link tables) are logical structures that may be implemented on one or more physical memory devices, such as a PC100 SDRAM; thus, a reference to a "memory" or "scan memory" in this disclosure is not intended to be limited to a single memory chip, circuit board or other single physical memory device. Those skilled in the art will recognize that link table data and scan data segment may be stored in one or more physical memory devices, or on the same physical memory device.

Figure 3:
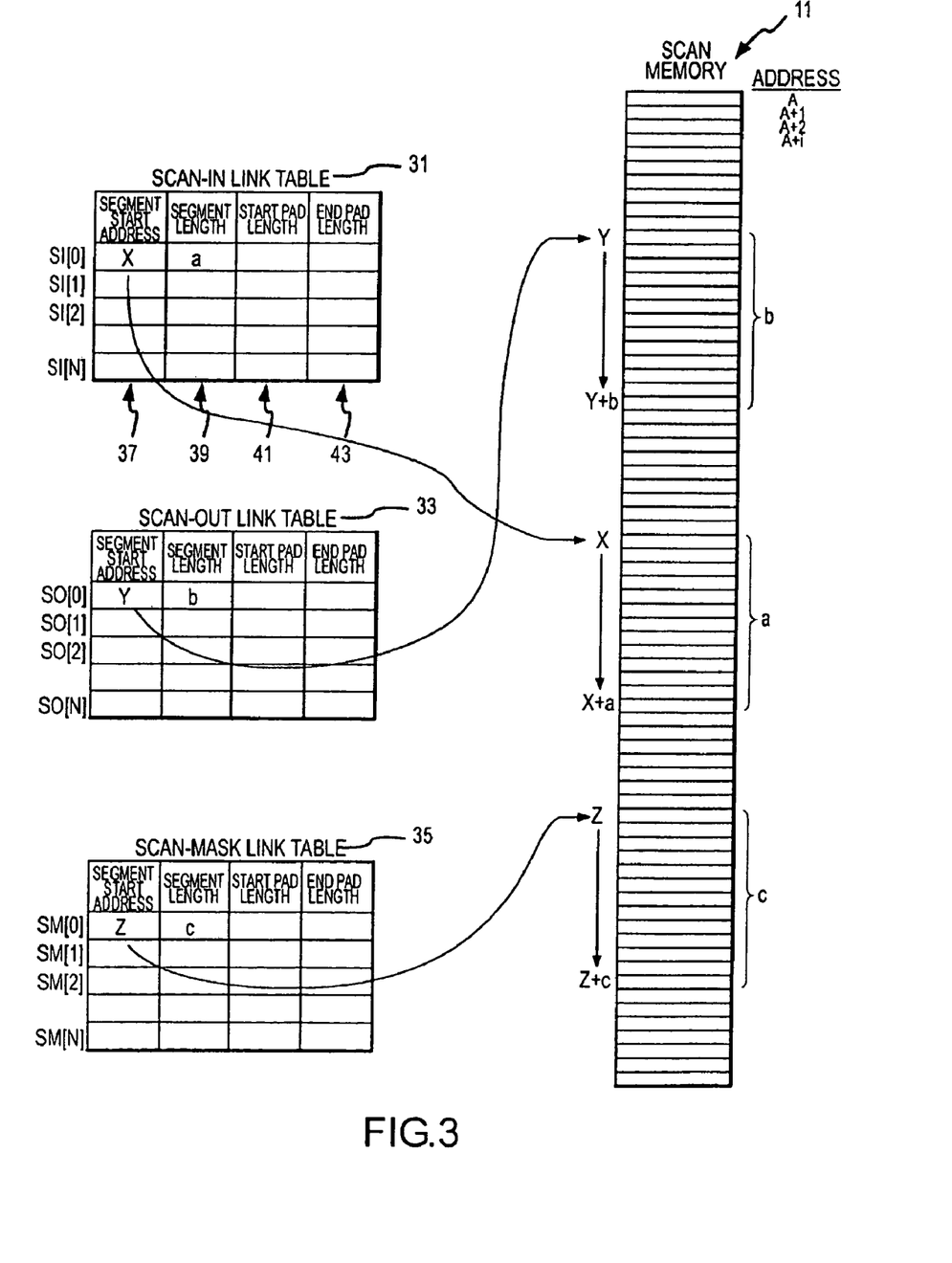
FIG. 3 is a block diagram of a link table data structure according to one embodiment.
Figure 5:
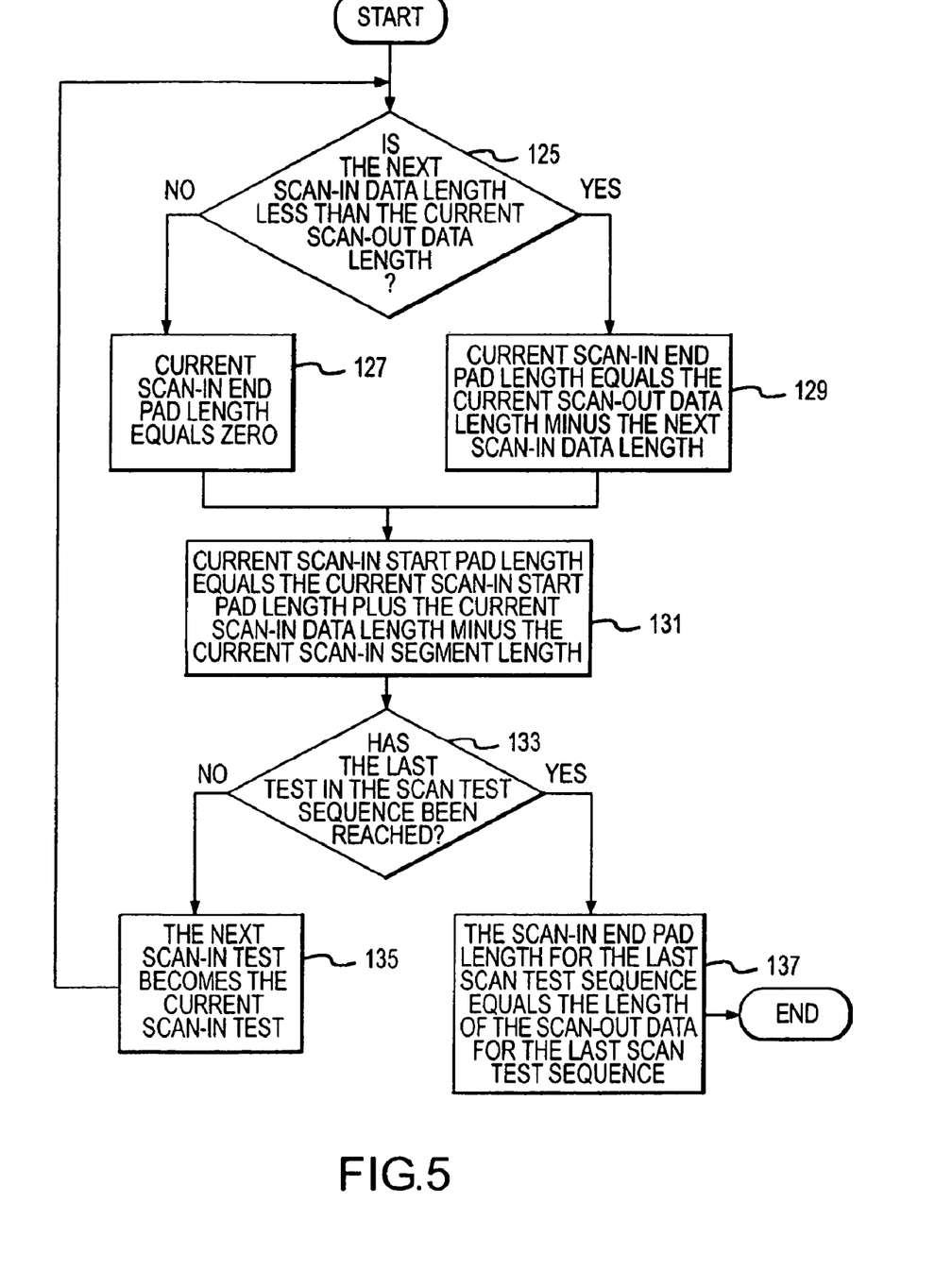
FIG. 5 is a flowchart showing a procedure for calculating the scan-in pad length values for a scan-in link table data structure according to one embodiment.
Figure 6:
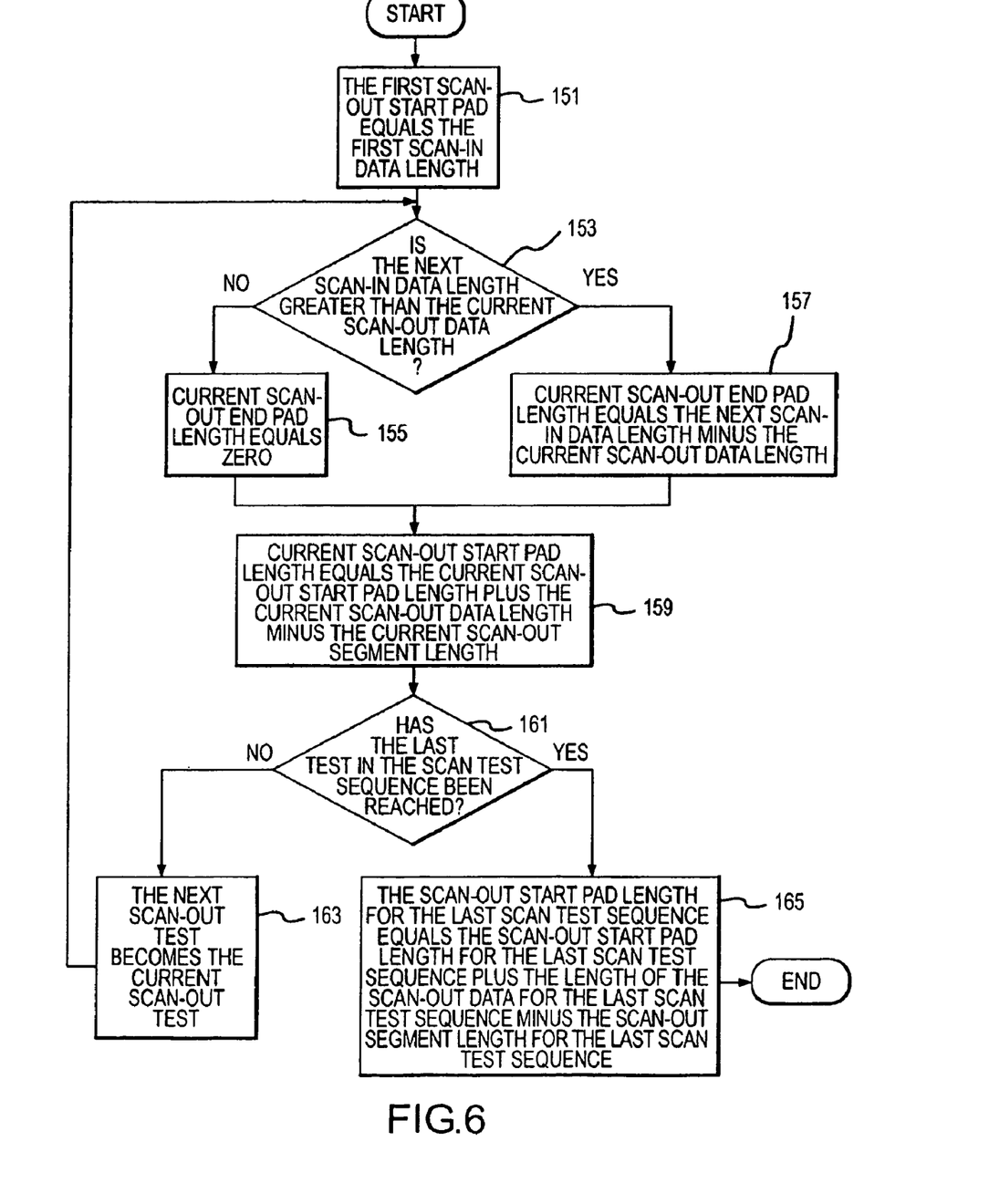
FIG. 6 is a flowchart showing a procedure for calculating the scan-out pad length values for a scan-out link table data structure according to one embodiment.

FIG. 3 is a diagram showing one embodiment of a link table data structure, and how it represents a stream of scan data segments stored in scan memory as described above. In this embodiment, three link tables are used: a scan-in link table 31 (SI[ ]), a scan-out link table 33 (SO[ ]), and a scan-mask link table 35 (SM[ ]). Each row n in a link table (e.g., SI[n], SO[n], or SM[n]) corresponds to a scan data segment used in test n of test stream sequence. In this embodiment, each row in a link table has four fields: a scan data segment start address 37, a scan data segment length 39, a start pad length 41, and an end pad length 43. Scan data segment start address 37 contains the address in scan memory 11 where a scan data segment starts. Scan data segment length 39 contains the length in bits of the scan data segment. The start pad length 41 contains the number of scan clock cycles that must elapse before the bits in the scan data segment identified by scan data segment start address 37 are transmitted by stream controller 17, 19, 21. The end pad length contains the number of scan clock cycles that must elapse after the end of the scan data segment identified by scan data segment start address 37 is reached and before the next row of the scan table (i.e., next scan data segment in the scan stream) is processed. Stream controllers 17, 19, 21 process scan data bit by bit in response to a scan increment signal 25 from global sequencer 1 in the order specified by the link tables. In one embodiment, stream controller 17, 19, 21 process rows in their respective link tables independently of one another, i.e., at a particular scan clock cycle, scan-in stream controller may be processing scan data at row n+1 of a link table while scan-out stream controller may be processing scan data at row n. Stream controllers 17, 19, 21 (FIG. 2) process scan data as specified in a link table row in the following order: the start pad length 41, the scan data segment (e.g., typically scan-in, scan-out and scan-mask data segments), and the end pad length 43. For the number of scan cycles specified by start pad length 41 or end pad length 43, stream controllers 17, 19, 21 (FIG. 2) typically transmit dummy data (zero signals). A method for calculating the start pad lengths 41 and end pad lengths 43 for each scan data segment is shown in FIGS. 5 and 6 below. When all the data as specified in a link table row is processed by the stream controllers 17, 19, 21, the stream controllers move to the next row to continue processing. Processing of a scan stream may be completed when all of the rows of the respective link table are processed, or when otherwise directed by global sequencer 1. In another embodiment, when the scan data segment length, start pad length, and end pad length values for a particular row are assigned logical zeros, stream controllers 17, 19, 21 process scan data in a straight-line method; in this method, stream controllers 17, 19, 21 retrieve scan data sequentially from memory starting at start address until the completion of the scan test.

As shown in FIG. 3, scan data segments occupy a contiguous portion of scan memory 11, and may be randomly distributed. The sequential structure of scan data segment start addresses 37 in a link table 31 (i.e., each successive link table row corresponds to a successive scan data segment) enables scan data segments that are not contiguously located in memory (as in a monolithic approach to scan data storage) to be processed sequentially. The added level of indirection provided by the link tables has the advantage of enabling efficient re-sequencing of scan data segments. New test sequences can be generated by merely re-sequencing the rows of the link tables and merely re-writing the link tables back into scan memory. This avoids time-consuming methods (such as the monolithic approach) of re-sequencing the rows of the link tables and merely re-writing the link tables back into scan memory. This avoids time-consuming methods (such as the monolithic approach) of re-sequencing where the scan data itself must be re-sequenced, re-built and downloaded as a block into memory in order to make even the most minimal changes in test sequence. An additional advantage is that because a test sequence constitutes a sequence of pointers, the scan data segments themselves, even if used multiple times in a test sequence, need only be stored once in memory. This prevents data redundancy and alleviates test system memory requirements. Scan streams may be embodied in many other data structures, such as a linked-list, an array, or a combination of an array and a linked-list.

In one embodiment, the link tables may be stored in the same physical memory as the scan data segments. Other embodiments may allocate physical memory in other ways. In one embodiment, the link tables may be contained in scan memory consisting of 72-bit ECC 256-megabyte DIMMs, such as standard PC100 SDRAMs. The start scan data segment address, scan data segment length, and start pad and end pad fields may occupy one 64-bit word according to the following breakdown: 24 bits for the start scan data segment address, 13 bits for the scan data segment length, 12 bits for the start pad length, 12 bits for the end pad length, and 3 bits for the enable and scan-data-immediate flags (the remaining 8 bits are used for ECC error correction).

In one embodiment, if the scan-data-immediate flag is enabled in a link table row, the respective stream controller runs in scan-data-immediate mode. In scan-data-immediate mode, a stream controller reads the link table row as having two fields: a data field and a counter field. The data field contains the scan data segment itself, in contrast to a pointer to the scan data segment in memory, and a counter field containing a repeat value for how often the scan data segment is to be consecutively processed when scanned out by the stream controllers. In this mode, scan testing saves processing time required to conduct a second memory access for retrieval of scan data segment by placing the scan data segment directly in the link table (the first memory access is required for retrieval of the link table data). Often lengthy sequences of scan data consist of shorter scan data patterns that are repeated; in this situation, one copy of the repeating pattern may be stored directly in the link table, and a counter provided to instruct stream controllers to process the pattern a given number of times before moving to the next scan data segment. Another embodiment of scan-data-immediate mode may use only the data field and omit the counter field.

In one embodiment, if a link table row contains a scan-disable flag, setting the flag prevents data from being driven to the respective DUT pin during the processing of that row. In another embodiment, setting the scan-disable flag prevents data from being driven to the DUT pin for the entire scan stream. Disabling scan data from certain DUT pins is sometimes needed to prevent excessive heat accumulation in the DUT which may damage the DUT or lead to erroneous test results. Disabling scan data from certain DUT pins can also be useful when concentrating a scan test to a particular portion of the device, thus saving data analysis time.

In a typical scan test iteration, the tester switches a DUT to scan mode, and scans a scan-in data segment into a DUT scan-chain by a scan clock. The DUT is then operated in normal mode for one or more system clock cycles to process one or more functional patterns, e.g., a Launch-Capture Delay test. The DUT is then returned to scan mode for scanning out the scan-chain states for comparison to scan-out and scan-mask data segments, and for scanning in the next scan data segment to commence the next scan test iteration. In this disclosure, the transition from scan mode to normal mode back to scan mode in the DUT will be referred to as a "DUT test mode transition." A "scan interval" will refer to the period during which a DUT is in scan mode (typically consisting of the period between DUT test mode transitions). Interleaving scan data segments means, in one embodiment, that a new scan-in data segment is scanned into a scan-chain as the old scan-chain states are scanned out for comparison with scan-out and scan-mask data segments; in other words, instead of waiting to refill a scan-chain with new data after the scan-chain is completely flushed of its old data, the two processes are overlapped. This saves both processing time and scan memory and, accordingly, testing cost.

Figure 4:
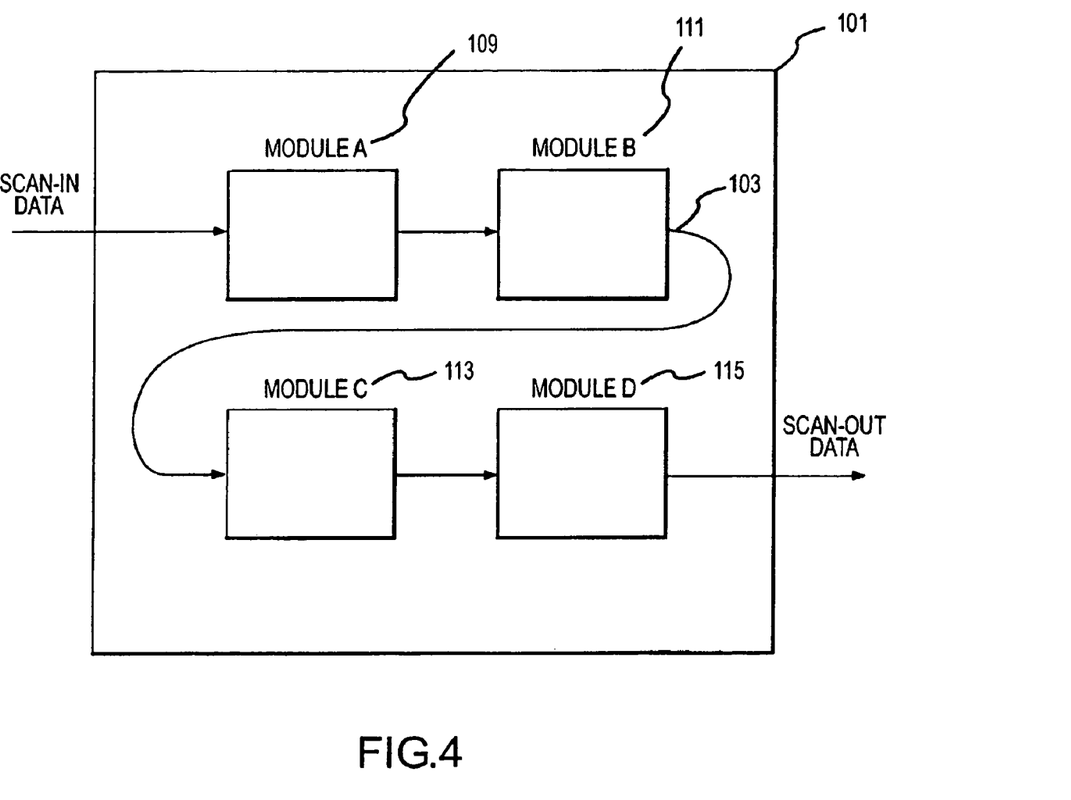
FIG. 4 illustrates a DUT with a scan-chain consisting of four linked modules.

A scan test is often directed to a particular subset of scan-chain state-holding elements, to be referred to herein as a "scan-chain module." Scan testing directed to scan-chain modules is desirable because DUT architectures typically enable testing of specific DUT components via one or more scan-chain modules. FIG. 4 shows a DUT 101 with a scan-chain 103 having four linked scan-chain modules 109, 111, 113, 115. In this situation, if it is assumed that scan data segment lengths are equal to the scan-chain module lengths they are designed to populate, then a scan test directed to Module B 111 will require tester to apply a number of scan clock signals at least equal in number to the bit lengths of Module B 111 plus Module A 109. This is required for fully positioning scan-in data in the target Module B 111. In other words, the tester switches the DUT 101 to scan mode, then first scans in scan-in data segment B, and second scans in dummy data equal in bit length to Module A 109 in order to shift the scan-in data segment B data fully into Module B (the scan-in data serially shifts through Module A to Module B). Likewise, when scanning out the states in Module B 111 for comparison with its respective scan-out data segment, processed scan data (which, in some embodiments, may or may not be dummy data from the previous scan test iteration) populating Modules D 115 and C 113 must first be scanned out before the targeted data in Module B 111 is reached. The following example illustrates how scan testing directed to DUT scan-chain modules or a segment of scan-chain modules may be performed.

Assume that a DUT has a scan-chain of bit length 3500 consisting of four scan-chain modules A, B, C and D (as shown in FIG. 4) with bit lengths of 1000, 1500, 500 and 500 respectively. Further assume the following example scan test sequence provided in Table 1:

TABLE 1

Example Scan Test Sequence

| Test 0 | Test all scan-chain modules | ABCD |
|---|---|---|
| Test 1 | Test B only | B |
| Test 2 | Test C only | C |
| Test 3 | Test B only | B |
| Test 4 | Test A, B, and C | ABC |

If interleaving is ignored, then the least amount of data that needs to be scanned in and out of the DUT to perform the test sequence is shown below in Table 2.

TABLE 2

Scan Chain Module Test Sequencing Example Data

| Test | Scan-In Data | Scan-In Data Length | Scan-Out Data | Scan-Out Data Length | Scan-Mask Data | Under Test Length |
|---|---|---|---|---|---|---|
| 0 | ABCD | 3500 | DCBA | 3500 | DCBA | 3500 |
| 1 | [A]B | 2500 | [DC]B | 2500 | B | 1500 |
| 2 | [AB]C | 3000 | [D]C | 1000 | C | 500 |
| 3 | [A]B | 2500 | [DC]B | 2500 | B | 1500 |
| 4 | ABC | 3000 | [D]CBA | 3500 | CBA | 3000 |

As shown in Table 2, scan-in data (column 1) and scan-in data (column 2) illustrate the amount of data per scan test iteration that must be scanned in and out of the DUT scan-chain due to the modular structure of the scan-chain in the shape of a queue. In the case of scan-in data (column 1), the value in the table graphically represents the data in the scan-chain in terms of either a scan data segment or dummy data per module for each scan test. Thus, for Test 0 (row 1), because all of the modules are to be tested (and no dummy data is used), the scan-in data (column 1) equals the scan-in data segments for all of the scan-chain modules; this is represented by "ABCD" with no brackets (bracketed letters represent modules receiving dummy data). The scan-in data length (column 2) constitutes the length of the scan-in data (both scan-in data segment and dummy data, if any), calculated by adding the lengths of the modules to be populated with scan-in data; in this case, the length of Modules A through D equals 3500 (Module A+Module B+Module C+Module D=1000+1500+500+500=3500). In contrast, in Test 1 (row 2), only Module B is tested. Thus, in Test 1, the scan-in data (column 1) is represented by "[A]B," which means that the scan-in data for testing Module B consists of the scan-in data segment for Module B (no brackets) along with dummy data for Module A (brackets). Note that in Test 1 the dummy data for Module A is placed in the scan stream after the scan-in data segment for Module B to ensure that the scan-in data segment is properly shifted into the Module B location in the DUT scan chain. The scan-in data length (column 2), consisting of dummy data and scan-in data segment, is 1500 (Module A dummy data+Module B scan-in data segment=1000+1500=2500).

Referring again to Table 2, the values for scan-out data (column 3) and scan-out data length (column 4) are calculated similarly to scan-in data (column 1) and scan-in data length (column 2). Note that the scan-out data segments (column 3) are timed to align with the order in which processed scan-chain data is scanned out of the DUT; this timing is accomplished because the processed scan-chain data is typically compared with the scan-out data (expected results) on a bit by bit basis immediately upon scanning out a bit of processed scan-chain data from the DUT scan-chain. In this disclosure, processed scan-chain data is the scan data populating a scan-chain after performance of a scan test. Thus, in the embodiment represented by Table 2, in Test 0 (row 1). the scan-out data is represented as "DCBA" with no brackets in column 3; this illustrates that the last state in Module D is the first state of processed scan-chain data scanned out of the DUT for comparison with the first bit of correspondingly ordered scan-out data segments. In contrast, in Test 1 (row 2), the scan test is directed solely to Module B, and therefore the processed scan-chain data populating modules D and C must be scanned out prior to reaching the target data in Module B, this is represented by "[DC]B" (row 2, column 3), where dummy data (indicated by the brackets) populating Modules D and C must be scanned out prior to the targeted processed scan data in Module B (no brackets). Lastly, scan-mast data (column 5) and the DUT module length (column 6, which refers to the bit length of the module under test) correspond in timing and length to the scan-out data segments of the scan-out data (shown as unbracketed modules in column 3). The timing and length of scan-mask data segments correspond with scan-out data segments because the embodiment assumes that all of the data within a targeted module may be a target of masking (other embodiments, however, may target a smaller subset of scan-chain states in a given scan-chain module for masking purposes). Table values for Tests 2-4 (rows 3-5) are calculated in the same manner as Test 0 (row 1) and Test 1 (row 2).

As described above, scan data segments are interleaved when the timing for processing the scan-in data overlaps the timing for processing of the scan-out and scan-mask data to the extent permitted by the scan-chain structure (specifically, the length and number of scan-chain modules). For purposes of this description (as described in reference to Table 2 above), "scan-in data" refers to the total amount of scan-chain data needed for scanning scan-in data segments into respective DUT modules; this includes one or more scan-in data segments and any dummy data for modules not under test. Likewise, "scan-out data" refers to the total amount of data in the scan-out stream required for processing the processed scan-chain data, specifically the processed scan-chain data populating the module under test; this amount is equivalent to the total amount of scan-chain data, including dummy data, that must be scanned out in order to retrieve the processed scan data from the targeted DUT module. The two terms (scan-in data and scan-out data) are illustrated in reference to Table 2. In Table 2, the scan-in data for Test 3 is [A]B, i.e., the dummy data in Module A and the scan-in data segment in Module B; the scan-out data is [DC]B which corresponds to scan-chain data populating the target Module B, including dummy data populating Modules D and C.

In one embodiment, interleaving is accomplished by associating scan data segments with pre-determined delay values or "padding" that enables the timing necessary for interleaving. In this embodiment, padding for scan data segments may include a start pad length and an end pad length representing the number of scan clock cycles that must elapse before and after a particular scan data segment is processed. In one embodiment, as shown in FIG. 3, the pad lengths are associated with each scan data segment by means of a link table. In one embodiment, pad lengths are calculated according to three rules: first, the DUT must be switched to normal mode after the last scan clock cycle required for scanning in a scan-in data segment; second, scanning out of processed scan-chain data must commence immediately after the DUJT is returned to scan mode; and third, scanning in of the next scan-in data segment must commence at the earliest scan clock cycle that does not violate the previous two rules. The third rule means that each scan interval will equal the greater of the scan-in data length and the prior scan-out data length for that scan interval.

FIGS. 5 and 6 are flowcharts describing procedures for calculating scan-in and scan-out pad length values respectively, according to one embodiment; the procedures assume that the link table pad length fields are initialized to zero. The procedures take as input module test sequencing data as provided, for example, in Table 2; pad values are then calculated for each consecutive test in the stream sequence (i.e., consecutive rows in the link table), often by reference to the next test in the sequence. Those skilled in the art would recognize that the procedures in FIGS. 5-6 may be coded in software using a number of conventional programming languages, such as C, C++, or Fortran, and conventional programming techniques, such as, typically, structured or object-oriented programming.

Turning to FIG. 5, in stage 125, the next scan-in data length in the test sequence is compared to the current scan-out data length. In stage 127, if the next scan-in data length is less than the current scan-out data length, then the end pad length for the current scan-in data segment is assigned the current scan-out data length minus the next scan-in data length. In stage 129, if the next scan-in data length is greater than or equal to the current scan-out data length, then the end pad length for the current scan-in data segment is assigned zero. In stage 131, the current scan-in start pad length is assigned the current scan-in start pad length plus the current scan-in data length minus the current scan-in data segment length. In stage 133, a determination is made as to whether the last scan test in the sequence has been reached. In stage 135, if the last test in the sequence has not been reached, then the next scan-in test becomes the current scan-in test, and stages 125 through 135 are repeated. In stage 137, if the last test in the sequence is reached, then the scan-in end pad length for the last scan test sequence equals the scan-out data length for the last scan-test sequence.

Turning to FIG. 6, in stage 151, the start pad length for the first scan-out data segment is assigned the current scan-in data length. In stage 153, the next scan-in data length is compared with the current scan-out data length. In stage 155, if the next scan-in data length is greater than the current scan-out data length, then the current scan-out end pad length is assigned the next scan-in data length minus the current scan-out data length. In stage 157, if the next scan-in data length is less than or equal to the current scan-out data length, then the current scan-out end pad length is assigned zero. In stage 159, the current scan-out start pad length is assigned the current scan-out start pad length plus the current scan-out data length minus the current scan-out data segment length. In stage 161, a determination is made as to whether the last test in the sequence is reached. In stage 163, if the last test in the sequence is not reached, then the next scan-out test becomes the current scan-out test, and stages 151 through 161 are repeated. In stage 165, if the last test in the sequence is reached, then the scan-out start pad length for the last scan test sequence equals the scan-out start pad length for the last scan test sequence plus the length of the scan-out data for the last scan-test sequence minus the scan-out data segment length for the last scan-test sequence.

Referring back to FIG. 5, the scan-in pad calculation procedure may be illustrated by applying the example data of the first test, Test 0 (row 1), of Table 2. Starting with the first test sequence, in stage 125, the next scan-in data length of 2500 (row 2, column 2) is less than the current scan-out data length of 3500 (row 1, column 4). Therefore, as required by stage 129, the scan-in end pad length for Test 0 is assigned 1000, i.e., the current scan-out data length (row 1, column 4) minus the next scan-in data length (row 2, column 2), or 3500−2500=1000. In stage 131, the current scan-in start pad length is assigned zero, i.e., the current scan-in start pad length (initialized to zero) plus the current scan-in data length (row 1, column 2) minus the current scan-in data segment length (provided in row 1, column 6, as DUT Module Under Test Length), or 0+3500−3500=0. In stage 133, the last scan test sequence has not been reached, and therefore in stage 135, the next scan-in test becomes the current scan-in test, and stages 125-133 are repeated.

Referring back to FIG. 6, the scan-out pad calculation procedure may also be illustrated by applying the example data of the first test, Test 0 (row 1), of Table 2. In stage 151, the first scan-out segment start pad is initially assigned 3500, i.e., the value for the first scan-in data length (row 1, column 2). In stage 153, the next scan-in data length of 2500 (row 2, column 2) is less than the current scan-out data length of 3500 (row 1, column 4), and therefore, in stage 155, the current scan-out end pad length for Test 0 is assigned zero. In stage 159, the current scan-out start pad length is assigned 3500, i.e., the current scan-out start pad length equals the current scan-out start pad length (initially set to 3500 in stage 151 for this example) plus the current scan-out data length (row 1, column 4) minus the current scan-out segment length (row 1, column 6, as DUT Module Under Test Length), or 3500+3500−3500=3500. In stage 163, the last scan test sequence has not been reached, and therefore in stage 163, the next scan-out test becomes the current scan-out test, and stages 153-161 are repeated. Pad length values for all of the test sequences in the scan-in and scan-out streams are calculated in a similar manner (following the logic flow provided in FIGS. 5-6) as provided in the above two examples. Other embodiments may calculate pad length values differently in order to implement some form of interleaving.

In one embodiment, in order to illustrate the interleaving process in accordance with the pad length calculation procedures provided in FIGS. 5 and 6, example scan-in, scan-out and scan-mask link tables were generated in accordance with the procedures of FIGS. 5-6; these tables are provided below in Table 3. Table 3 is intended to illustrate the interleaving process, and therefore the segment start address fields of the link tables are omitted; instead, the segment start address fields contain the modules to be tested in parenthesis to represent an address pointer to segment data in memory designed to fill the specified modules. In this embodiment, the scan-mask segments correspond in length to the scan-out segments, and therefore share the same pad lengths (shown in Table 3 below).

TABLE 3

Example Link Tables

| Test | Segment Start Address | Segment Length | Start Pad Length | End Pad Length |
|---|---|---|---|---|
| Scan-In Link Table | | | | |
| 0 | (ABCD) | 3500 | 0 | 1000 |
| 1 | (B) | 1500 | 1000 | 0 |
| 2 | (C) | 500 | 2500 | 0 |
| 3 | (B) | 1500 | 1000 | 0 |
| 4 | (ABC) | 3000 | 0 | 3500 |
| Scan-Out Link Table | | | | |
| 0 | (ABCD) | 3500 | 3500 | 0 |
| 1 | (B) | 1500 | 1000 | 500 |
| 2 | (C) | 500 | 500 | 1000 |
| 3 | (B) | 1500 | 1000 | 500 |
| 4 | (ABC) | 3000 | 500 | 0 |
| Scan-Mask Link Table | | | | |
| 0 | (ABCD) | 3500 | 3500 | 0 |
| 1 | (B) | 1500 | 1000 | 500 |
| 2 | (C) | 500 | 500 | 1500 |
| 3 | (B) | 1500 | 1000 | 500 |
| 4 | (ABC) | 3000 | 500 | 0 |

Figure 7:
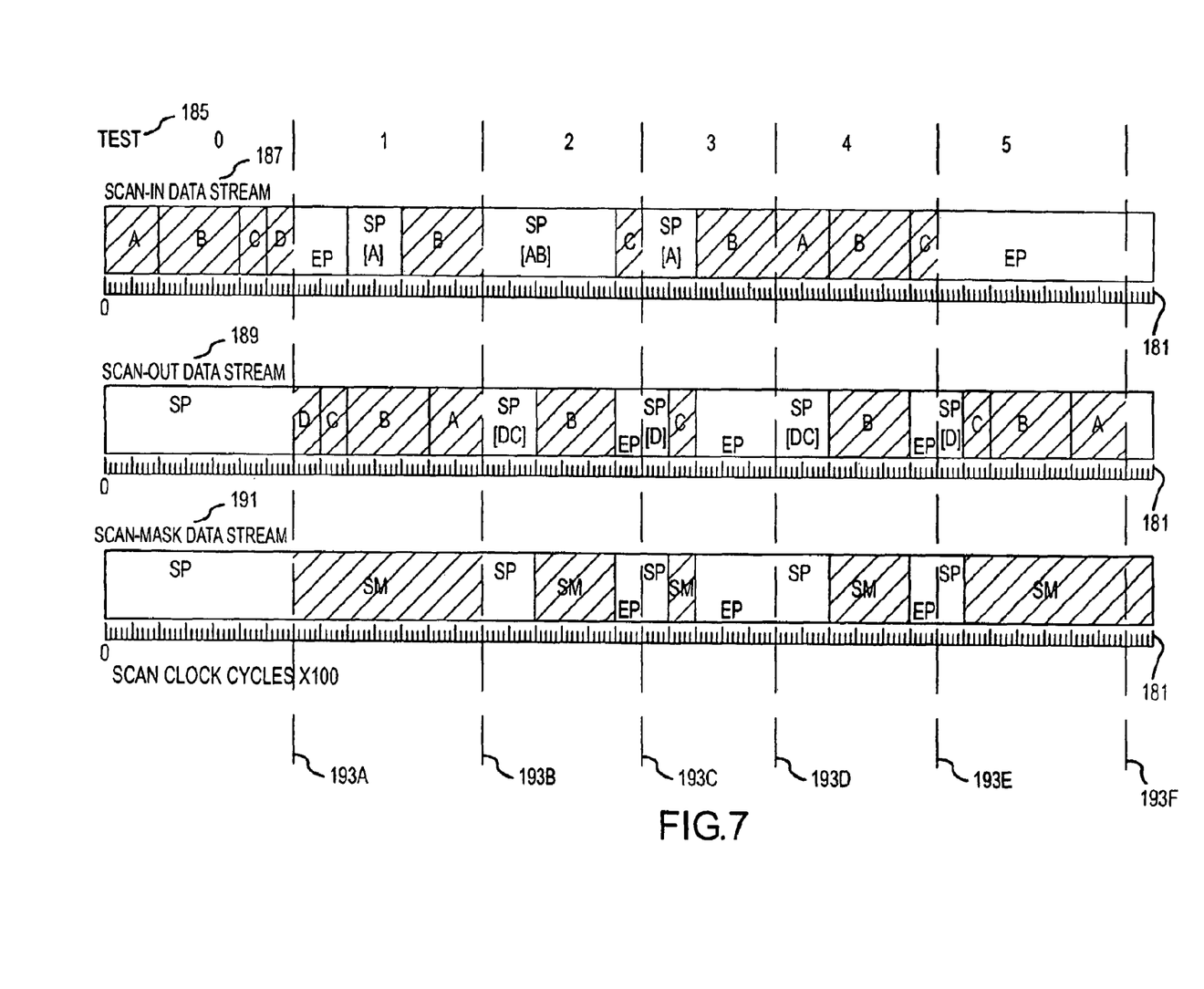
FIG. 7 illustrates the interleaving of three scan streams on a scan-clock time-line according to one embodiment.

FIG. 7 illustrates the interleaving process for three scan streams (scan-in stream 187, scan-out stream 189, and scan-mask stream 191) on scan clock time-line 181 according to one embodiment. Time-lines 181 are measured in units of one-hundred scan clock cycles. Time-lines 181 are divided by six vertical dotted-lines representing six DUT test mode transitions 193A-F; each DUT test mode transition 193A-F demarcates an interleaved scan test even labeled 0 through 5. (Note that N test data sequences requires N+1 scan test intervals for complete processing because only scan-in data is processed during the first scan test interval; thus, processing of the five scan data sequences represented in the link tables of Table 3 requires six scan intervals for processing. This process is described below in reference to FIG. 7.) The DUT test mode transitions 193A-F are represented by vertical lines to reflect both that no scan clock cycles elapse when the DUT is placed in normal mode, and that interleaving is conducted entirely during scan mode. As described above, in one embodiment, steam controllers 17, 19, 21 (FIG. 2) process link tables row by row independently of one another in response to a scan-increment command from global sequencer. Rows are processed in the following order: the start pad length, the scan data segment, and the end pad length. Scan data segments in FIG. 7 are represented by blocks having diagonal lines. In operation, steam controllers transmit one bit of data per scan clock cycle (i.e., scan-increment command) for the number of scan clock cycles specified by the pad and scan data segment lengths; stream controllers typically transmit dummy data when processing pad lengths. This process is illustrated below in reference to scan-in stream 187 (and its respective scan-in link table), but all scan streams (e.g., scan-out and scan-mask streams) are processed in the identical manner in this embodiment.

Referring to FIG. 7, in one embodiment, scan-in stream controller processes the scan-in link table as provided in Table 3. The process occurs as follows:

In Scan-In Test 0. Scan-in stream controller begins by reading row 1 of scan-in link table; because start pad length is zero, scan data segments are immediately processed for 3500 scan clock cycles as specified by scan data segment length. As a result, Modules A, B, C and D of scan-chain 103 (FIG. 4) are filled; this is represented as blocks labeled A, B, C, and D having diagonal lines in Test 0 of scan-in stream 1897. As described above, in one embodiment, Test 0 ends and DUT test mode transition 193A begins when the scan-in data segments have been completely scanned into the DUT.

In Scan-In Test 1. Scan-in stream controller now processes the end pad length in row 1 by transmitting dummy data for 1000 scan clock cycles; this is shown as block labeled "EP" in Test 2 of scan-in stream 187. This completes processing of row 1 of the scan-in link table (Table 3), and scan-in stream controller then automatically starts processing data as specified by row 2. In processing row 2, can-in stream controller first transmits dummy data for 1000 scan clock cycles as specified by the start pad length; this is shown as block labeled "SP" and "[A]" in Test 1 or scan-in stream 187. (The bracketed "[A]" represents that the start pad data represents dummy data for filling Module A.) Scan-in stream controller then transmits a scan-in data segment for 1500 scan clock cycles as specified by the scan data segment length; this is shown as block having diagonal lines labeled "B" on scan-in stream 187 (the "B" represents that the segment has been completely scanned into the scan-chain, thus preparing for DUT test mod transition 193B.

In Scan-In Test 2. Scan-in stream controller automatically begins processing row 3 because the end pad length for row 2 is zero (Table 3). In row 3, dummy data is transmitted for 2500 scan clock cycles as specified by the start pad value; this is shown as block labeled "SP" and "[AB]." A scan data segment is next scanned for 500 scan clock cycles (scan data segment length); this is shown by the next block (having diagonal lines) on scan-in stream 187 labeled "C." Test 2 then ends because the scan-in data segment has been completely scanned into the scan-chain, causing DUT test mode transition 193C. Scan-in data for Tests 3-4 are calculated in the same manner as in Tests 0-2. Test 5, which is the last test in the test sequence, consists of a single end pad in which scan-in stream controller transmits dummy data for the duration of the test; this is shown as the block labeled "EP" in Test 5.

The scan-out stream 189 and the scan-mask stream 191 (and their respective link tables) are processed in identical manner to the scan-in stream (and link table). As shown in FIG. 7, this means that in Test 0 of the scan-out stream, scan-out stream controller and scan-mask stream controllers transmit dummy data as specified by the start pads in row 1 of their respective link tables; this is required because no data in the scan-chain has yet been processed. In addition, in the embodiment of FIG. 7, all scan-chain states populated by a scan-in data segment are tested; thus, the scan-mask data segment for each test is equal in length and timing to the corresponding scan-out data segment. Other embodiments may seek to test only a subset of states within a DUT module; this is accomplished by means of a scan-mask data segment of appropriate length and timing. Typically, the scan-mask data segment is a sequence of logical ones (non-scan-mask segment data are logical zeros) to indicate that a matching sequence of processed scan-chain bits (states) are to be tested by a matching scan-out data segment in a particular scan test iteration. The timing and length of scan-mask data segments is dependent on the DUT, and typically created by a general purpose computer with specialized application software; it is later downloaded to the ester scan memory prior to conducting a test. Programming application software for calculating pad length values pursuant to the flowcharts described in FIGS. 5 and 6 is performed according to conventional programming techniques.

In summary, as shown in FIG. 7, interleaving of scan streams is accomplished by timing the processing of scan data segments by means of pad lengths; this results in savings of processing time, scan memory, and ultimately test cost.

The present disclosure describes but does not limit the present invention. Embodiments other than the ones described herein are within the scope of the invention as the invention is set forth in the following claims.

We claim:

1. A scan sequencing module for an integrated circuit tester, the scan sequencing module comprising:
    at least one memory which stores scan stream data, wherein the scan stream data includes a plurality of sequences of scan data segments not contiguously located in the at least one memory and associated link table data;
    at least one memory controller coupled to the memory, wherein the plurality of scan data segments are retrieved from the memory as determined by the link table data; and
    at least one stream controller coupled to the memory controller, wherein scan data segment bits or dummy data bits are transmitted to a device under test as determined by the link table data.

2. The scan sequencing module of claim 1, wherein at least one data buffer is coupled between the stream controller and the scan memory controller.

3. The scan sequencing module of claim 1, further comprising a global sequencer coupled to the stream controllers, wherein scan data is transmitted by the stream controllers in response to each scan increment signal received from the global sequencer.

4. The scan sequencing module of claim 1 wherein the at least one memory comprises means for storing scan stream data.

5. The scan sequencing module of claim 1 wherein the at least one memory controller comprises means for retrieving the scan stream data from the at least one memory.

6. The scan sequencing module of claim 1 wherein the at least one stream controller comprises means for transmitting the scan stream data bits to the device under test.

7. The scan sequencing module of claim 1 wherein said link table data comprises:
    a pointer to each scan data segment;
    a scan data segment length for each scan data segment;
    a start pad length for each scan data segment; and
    an end pad length for each scan data segment.

8. A scan sequencing module for an integrated circuit tester, the scan sequencing module comprising:
    a means for storing scan stream data, wherein the scan stream data includes a plurality of sequences of scan data segments not contiguously located in the means for storing scan stream data and associated link table data;
    a means for controlling said means for storing scan stream data coupled to the means for storing scan stream data, wherein the plurality of scan data segments are retrieved from the means for storing scan stream data as determining by the link table data; and
    a means for controlling streams coupled to the means for storing scan stream data, wherein scan data segment bits or dummy data bits are transmitted to a device under test as determined by the link table data.

* * * * *